United States Patent
Fish et al.

(10) Patent No.: US 7,502,001 B2
(45) Date of Patent: Mar. 10, 2009

(54) LIGHT EMISSIVE ACTIVE MATRIX DISPLAY DEVICES WITH OPTICAL FEEDBACK EFFECTIVE ON THE TIMING, TO COUNTERACT AGEING

(75) Inventors: David A. Fish, Haywards Heath (GB); John M. Shannon, Whyteleafe (GB); Steven C. Deane, Redhill (GB); Jason R. Hector, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 514 days.

(21) Appl. No.: 10/548,343

(22) PCT Filed: Feb. 27, 2004

(86) PCT No.: PCT/IB2004/000647

§ 371 (c)(1),
(2), (4) Date: Sep. 7, 2005

(87) PCT Pub. No.: WO2004/084168

PCT Pub. Date: Sep. 30, 2004

(65) Prior Publication Data
US 2006/0208979 A1 Sep. 21, 2006

(30) Foreign Application Priority Data
Mar. 12, 2003 (GB) .............................. 0305632.2
Jul. 30, 2003 (GB) .............................. 0317821.7

(51) Int. Cl.
*G09G 3/30* (2006.01)

(52) U.S. Cl. ........................................ 345/81; 345/207

(58) Field of Classification Search ............. 345/55–56, 345/76–83, 204, 207; 315/169.3; 313/505, 313/509
See application file for complete search history.

(56) References Cited

U.S. PATENT DOCUMENTS

| 5,910,792 A | 6/1999 | Hansen et al. |
| 6,392,617 B1 | 5/2002 | Gleason |
| 6,441,560 B1 * | 8/2002 | Hunter .................... 315/169.1 |

(Continued)

FOREIGN PATENT DOCUMENTS

EP  0507061 A2  10/1992

(Continued)

OTHER PUBLICATIONS

D. Fish, "A Comparison of Pixel Circuits for Active Matrix Polymer/Organic LED Displays", 32.1 SID 02 Digest, May 2002.

*Primary Examiner*—Amare Mengistu
*Assistant Examiner*—Jennifer Zubajlo

(57) ABSTRACT

In an active matrix display, each pixel has a storage capacitor for storing a voltage to be used for addressing a drive transistor. A discharge transistor is provided for discharging the storage capacitor thereby to switch off the drive transistor. The timing of this is controlled by a light-dependent device which is illuminated by the display element. The drive transistor is controlled to provide a constant light output from the display element, and the duration is controlled in dependence on the data voltage. Optical feedback is used to alter further the timing of operation of the discharge transistor to provide ageing compensation of the display element and compensation for changes in the drive transistor.

25 Claims, 15 Drawing Sheets

U.S. PATENT DOCUMENTS

| | | |
|---|---|---|
| 2001/0043172 A1 | 11/2001 | Mc Grath et al. |
| 2002/0036291 A1 | 3/2002 | Parker et al. |
| 2002/0063844 A1 | 5/2002 | Matsuura et al. |
| 2002/0118150 A1* | 8/2002 | Kwon ..................... 345/76 |
| 2002/0135542 A1 | 9/2002 | Kim et al. |
| 2003/0011584 A1* | 1/2003 | Azami et al. ............ 345/204 |
| 2003/0016190 A1* | 1/2003 | Kondo ..................... 345/55 |
| 2003/0142047 A1* | 7/2003 | Inoue et al. .............. 345/82 |
| 2007/0236430 A1* | 10/2007 | Fish ....................... 345/82 |

FOREIGN PATENT DOCUMENTS

| | | |
|---|---|---|
| EP | 0717446 A2 | 6/1996 |
| EP | 1096466 A1 | 5/2001 |
| EP | 1220191 A2 | 7/2002 |
| WO | 9636959 A2 | 11/1996 |
| WO | 0120591 A1 | 3/2001 |
| WO | 02075711 A1 | 9/2002 |

* cited by examiner

LIGHT EMISSIVE ACTIVE MATRIX DISPLAY DEVICES WITH OPTICAL FEEDBACK EFFECTIVE ON THE TIMING, TO COUNTERACT AGEING

This invention relates to active matrix display devices, particularly but not exclusively active matrix electroluminescent display devices having thin film switching transistors associated with each pixel.

Matrix display devices employing electroluminescent, light-emitting, display elements are well known. The display elements may comprise organic thin film electroluminescent elements, for example using polymer materials, or else light emitting diodes (LEDs) using traditional III-V semiconductor compounds. Recent developments in organic electroluminescent materials, particularly polymer materials, have demonstrated their ability to be used practically for video display devices. These materials typically comprise one or more layers of a semiconducting conjugated polymer sandwiched between a pair of electrodes, one of which is transparent and the other of which is of a material suitable for injecting holes or electrons into the polymer layer.

The polymer material can be fabricated using a CVD process, or simply by a spin coating technique using a solution of a soluble conjugated polymer. Ink-jet printing may also be used. Organic electroluminescent materials can be arranged to exhibit diode-like I-V properties, so that they are capable of providing both a display function and a switching function, and can therefore be used in passive type displays. Alternatively, these materials may be used for active matrix display devices, with each pixel comprising a display element and a switching device for controlling the current through the display element.

Display devices of this type have current-addressed display elements, so that a conventional, analogue drive scheme involves supplying a controllable current to the display element. It is known to provide a current source transistor as part of the pixel configuration, with the gate voltage supplied to the current source transistor determining the current through the display element. A storage capacitor holds the gate voltage after the addressing phase.

FIG. 1 shows a known pixel circuit for an active matrix addressed electroluminescent display device. The display device comprises a panel having a row and column matrix array of regularly-spaced pixels, denoted by the blocks 1 and comprising electroluminescent display elements 2 together with associated switching means, located at the intersections between crossing sets of row (selection) and column (data) address conductors 4 and 6. Only a few pixels are shown in the Figure for simplicity. In practice there may be several hundred rows and columns of pixels. The pixels 1 are addressed via the sets of row and column address conductors by a peripheral drive circuit comprising a row, scanning, driver circuit 8 and a column, data, driver circuit 9 connected to the ends of the respective sets of conductors.

The electroluminescent display element 2 comprises an organic light emitting diode, represented here as a diode element (LED) and comprising a pair of electrodes between which one or more active layers of organic electroluminescent material is sandwiched. The display elements of the array are carried together with the associated active matrix circuitry on one side of an insulating support. Either the cathodes or the anodes of the display elements are formed of transparent conductive material. The support is of transparent material such as glass and the electrodes of the display elements 2 closest to the substrate may consist of a transparent conductive material such as ITO so that light generated by the electroluminescent layer is transmitted through these electrodes and the support so as to be visible to a viewer at the other side of the support. Typically, the thickness of the organic electroluminescent material layer is between 100 nm and 200 nm. Typical examples of suitable organic electroluminescent materials which can be used for the elements 2 are known and described in EP-A-0 717446. Conjugated polymer materials as described in WO96/36959 can also be used.

FIG. 2 shows in simplified schematic form a known pixel and drive circuitry arrangement for providing voltage-addressed operation. Each pixel 1 comprises the EL display element 2 and associated driver circuitry. The driver circuitry has an address transistor 16 which is turned on by a row address pulse on the row conductor 4. When the address transistor 16 is turned on, a voltage on the column conductor 6 can pass to the remainder of the pixel. In particular, the address transistor 16 supplies the column conductor voltage to a current source 20, which comprises a drive transistor 22 and a storage capacitor 24. The column voltage is provided to the gate of the drive transistor 22, and the gate is held at this voltage by the storage capacitor 24 even after the row address pulse has ended.

The drive transistor 22 in this circuit is implemented as a p-type TFT, so that the storage capacitor 24 holds the gate-source voltage fixed. This results in a fixed source-drain current through the transistor, which therefore provides the desired current source operation of the pixel.

In the above basic pixel circuit, for circuits based on polysilicon, there are variations in the threshold voltage of the transistors due to the statistical distribution of the polysilicon grains in the channel of the transistors. Polysilicon transistors are, however, fairly stable under current and voltage stress, so that the threshold voltages remain substantially constant.

The variation in threshold voltage is small in amorphous silicon transistors, at least over short ranges over the substrate, but the threshold voltage is very sensitive to voltage stress. Application of the high voltages above threshold needed for the drive transistor causes large changes in threshold voltage, which changes are dependent on the information content of the displayed image. There will therefore be a large difference in the threshold voltage of an amorphous silicon transistor that is always on compared with one that is not. This differential ageing is a serious problem in LED displays driven with amorphous silicon transistors.

In addition to variations in transistor characteristics there is also differential ageing in the LED itself. This is due to a reduction in the efficiency of the light emitting material after current stressing. In most cases, the more current and charge passed through an LED, the lower the efficiency.

It has been recognised that a current-addressed pixel (rather than a voltage-addressed pixel) can reduce or eliminate the effect of transistor variations across the substrate. For example, a current-addressed pixel can use a current mirror to sample the gate-source voltage on a sampling transistor through which the desired pixel drive current is driven. The sampled gate-source voltage is used to address the drive transistor. This partly mitigates the problem of uniformity of devices, as the sampling transistor and drive transistor are adjacent each other over the substrate and can be more accurately matched to each other. Another current sampling circuit uses the same transistor for the sampling and driving, so that no transistor matching is required, although additional transistors and address lines are required.

There have also been proposals for voltage-addressed pixel circuits which compensate for the aging of the LED material. For example, various pixel circuits have been proposed in which the pixels include a light sensing element. This element is responsive to the light output of the display element and acts to leak stored charge on the storage capacitor in response to the light output, so as to control the integrated light output of the display during the address period. FIG. 3 shows one example of pixel layout for this purpose. Examples of this type of pixel configuration are described in detail in WO 01/20591 and EP 1 096 466.

In the pixel circuit of FIG. 3, a photodiode 27 discharges the gate voltage stored on the capacitor 24. The EL display element 2 will no longer emit when the gate voltage on the drive transistor 22 reaches the threshold voltage, and the storage capacitor 24 will then stop discharging. The rate at which charge is leaked from the photodiode 27 is a function of the display element output, so that the photodiode 27 functions as a light-sensitive feedback device. It can be shown that the integrated light output, taking into the account the effect of the photodiode 27, is given by:

$$L_T = \frac{C_S}{\eta_{PD}}(V(0) - V_T) \quad [1]$$

In this equation, $\eta_{PD}$ is the efficiency of the photodiode, which is very uniform across the display, $C_S$ is the storage capacitance, $V(0)$ is the initial gate-source voltage of the drive transistor and $V_T$ is the threshold voltage of the drive transistor. The light output is therefore independent of the EL display element efficiency and thereby provides aging compensation. However, $V_T$ varies across the display so it will exhibit non-uniformity. Reference is made to the paper "A comparison of pixel circuits for Active Matrix Polymer/Organic LED Displays" by D. A. Fish et al., 32.1, SID 02 Digest, May 2002.

There are refinements to this basic circuit, but the problem remains that practical voltage-addressed circuits are still susceptible to threshold voltage variations. Thus, the circuit of FIG. 3 will not compensate for the stress induced threshold voltage variations of an amorphous silicon drive transistor. Furthermore, as the capacitor holding the gate-source voltage is discharged, the drive current for the display element drops gradually. Thus, the brightness tails off. This gives rise to a lower average light intensity.

According to the invention, there is provided an active matrix display device comprising an array of display pixels, each pixel comprising:

a current-driven light emitting display element;

a drive transistor for driving a current through the display element;

a storage capacitor for storing a voltage to be used for addressing the drive transistor;

a discharge transistor for discharging the storage capacitor thereby to switch off the drive transistor; and a light-dependent device for controlling the timing of the operation of the discharge transistor by varying the gate voltage applied to the discharge transistor in dependence on the light output of the display element.

The storage capacitor may be a separate component or it may be a parasitic capacitance of the drive transistor.

In this arrangement, the drive transistor can be controlled to provide a constant light output from the display element. The optical feedback, for aging compensation, is used to alter the timing of operation (in particular the turning on) of a discharge transistor, which in turn operates to switch off the drive transistor rapidly. The timing of operation of the discharge transistor can also be dependent on the data voltage to be applied to the pixel. In this way, the average light output can be higher than schemes which switch off the drive transistor more slowly in response to light output. The display element can thus operate more efficiently.

Any drift in the threshold voltage of the drive transistor will manifest itself as a change in the (constant) brightness of the display element. As a result, the optical feedback circuit of the invention compensates for variations in output brightness resulting both from LED ageing and drive transistor threshold voltage variations. Thus, compensation for threshold voltage variations is obtained, provided the threshold voltage of the discharge transistor does not change.

The light dependent device may comprise a photodiode. This may be used to charge or discharge a discharge capacitor which is provided between the gate of the discharge transistor and a constant voltage line. When the capacitor has sufficient charge (which may be more or less than originally), the discharge transistor turns on. The light dependent device is thus for discharging or charging the discharge capacitor.

Each pixel may further comprise an address transistor connected between a data signal line and an input to the pixel. The data signal on the data signal line can be provided by the address transistor to the gate of the discharge transistor. The discharge transistor is biased in use such that this results in the discharge transistor being turned off until the discharge capacitor has been charged or discharged by an amount dependent on the data voltage.

Each pixel preferably further comprises a charging transistor connected between a charging line and the gate of the drive transistor. This is used to charge the storage capacitor to a voltage which corresponds to a fully on condition of the drive transistor, and is required for n-type drive transistors with a common cathode display configuration.

The charging line may comprise a power supply line which supplies power to the display element and the drive transistor, or else a separate charging line may be used.

Each pixel preferably further comprises a bypass transistor connected between the source of the drive transistor and a bypass line. This is used to fix the source voltage of the drive transistor during the addressing phase when a data voltage is being stored in the pixel and turns off the display element. Alternatively, each pixel may further comprise an isolating transistor connected in series with the drive transistor for the same purpose.

Each pixel may comprise first and second address transistors each connected between the data signal line and a respective one of the storage capacitor and the gate of the discharge capacitor.

In this arrangement, the data line can be used to define the voltage on the storage capacitor as well as the starting voltage on the discharge transistor gate. One of the first and second address transistors is an n-type transistor and the other is a p-type transistor. They can then be controlled by a single control line to operate in complementary manner.

The pixel circuit can be implemented using amorphous silicon n-type transistors or polysilicon n-type and p-type transistors. The polysilicon transistors may be all p-type, all n-type or a mix of n-type and p-type devices.

The invention also provides a method of driving an active matrix display device comprising an array of display pixels each comprising a drive transistor and a current-driven light emitting display element, the method comprising, for each addressing of the pixel:

applying a drive voltage to an input of the pixel;

storing a voltage derived from the drive voltage on a discharge capacitor;

driving the drive transistor using a voltage on a storage capacitor;

switching on a discharge transistor using charge flow through a light dependent device illuminated by the light output of the electroluminescent display element, the charge flow charging or discharging the discharge capacitor; and discharging the storage capacitor using the discharge transistor thereby to turn off the drive transistor.

The storage capacitor may be a separate component or it may be a parasitic capacitance of the drive transistor.

The invention will now be described by way of example with reference to the accompanying drawings, in which.

Figure 1:
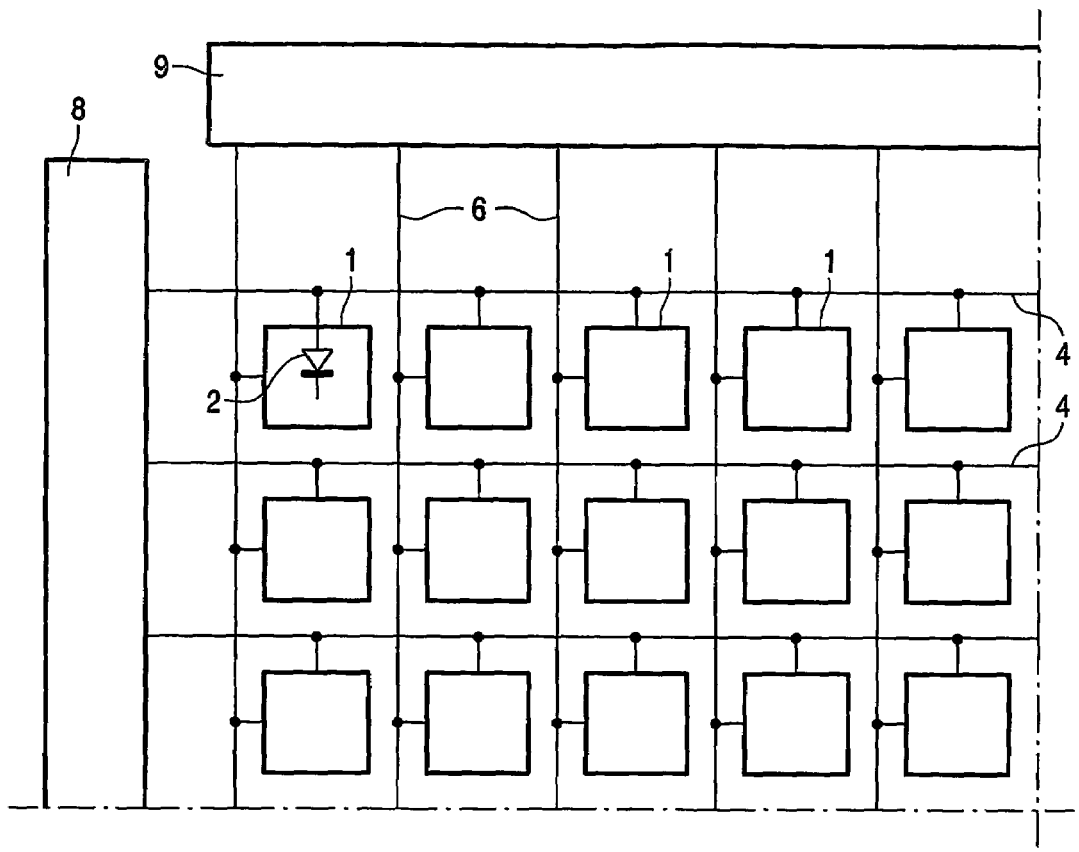
FIG. 1 shows a known EL display device.

It should be noted that these figures are diagrammatic and not drawn to scale. Relative dimensions and proportions of parts of these figures have been shown exaggerated or reduced in size, for the sake of clarity and convenience in the drawings.

In accordance with the invention, the pixel circuitry is modified so that the drive transistor is driven with a constant gate voltage during a given frame period, and the period of time during which the display element is illuminated (at a constant brightness) takes into account the aging effect both of the LED material and the drive transistor as well as the desired brightness output.

Figure 2:
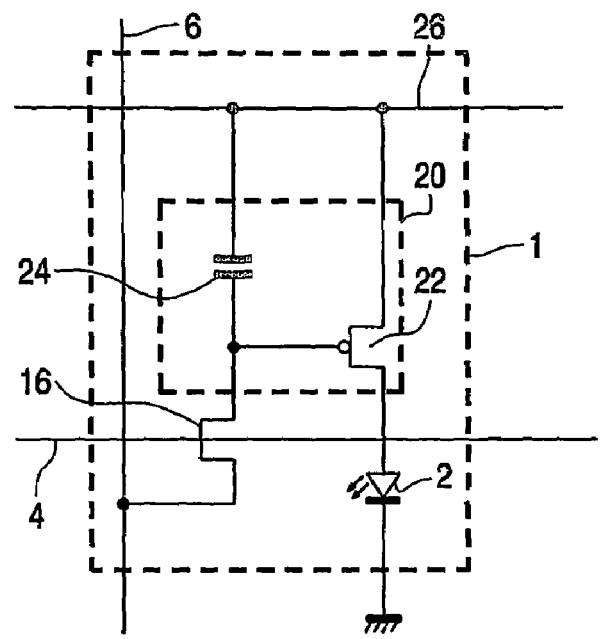
FIG. 2 is a simplified schematic diagram of a known pixel circuit for current-addressing the EL display pixel.
Figure 3:
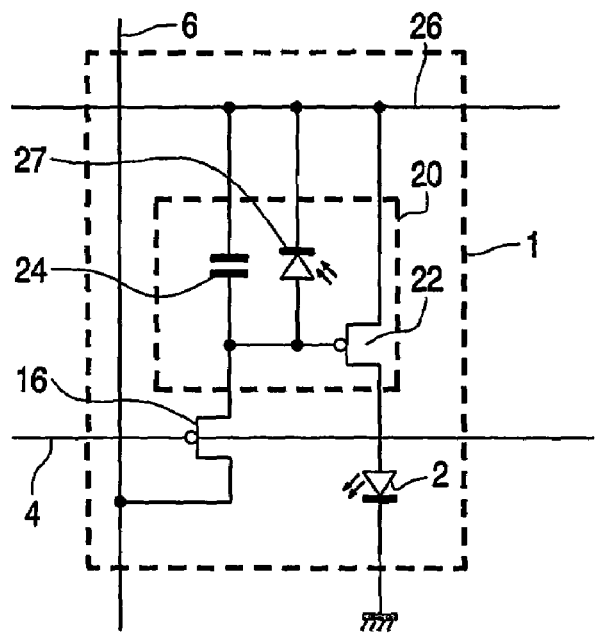
FIG. 3 shows a known pixel design which compensates for differential aging.
Figure 4:
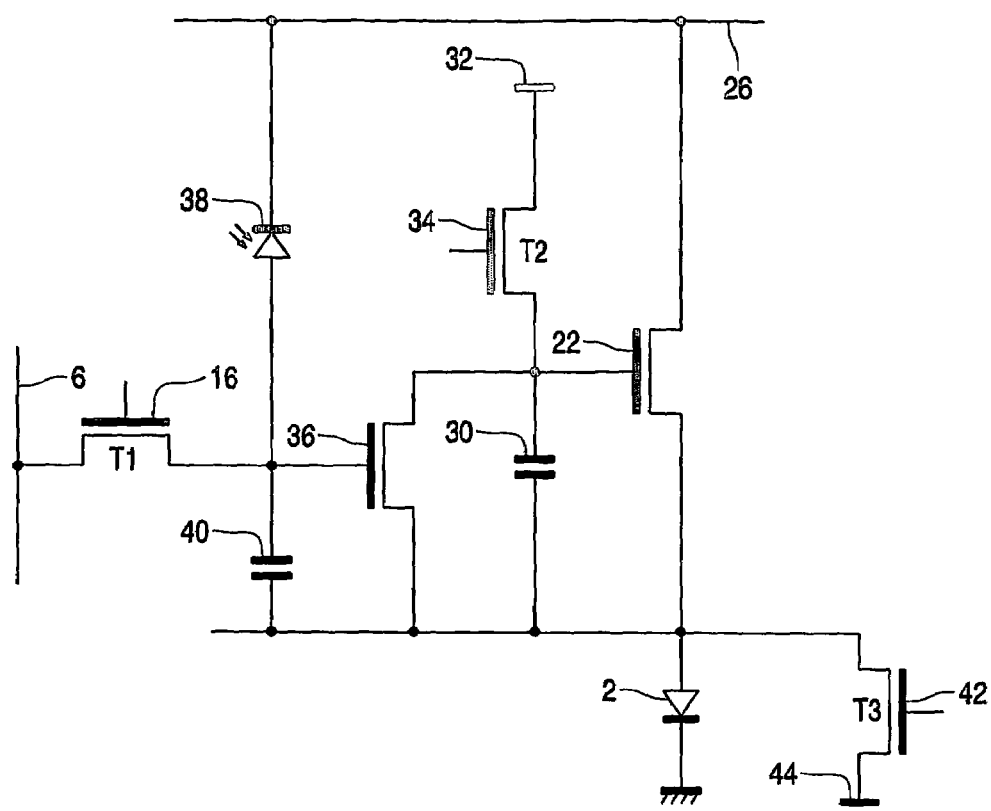
FIG. 4 shows a first example of pixel circuit according to the invention.

FIG. 4 shows a first example of pixel layout of the invention. The same reference numerals are used to denote the same components as in FIGS. 2 and 3, and the pixel circuit is for use in a display such as shown in FIG. 1. The circuit of FIG. 4 is suitable for implementation using amorphous silicon n-type transistors.

The gate-source voltage for the drive transistor 22 is again held on a storage capacitor 30. However, in the circuit of the invention, this capacitor is charged to a fixed voltage from a charging line 32, by means of a charging transistor 34 (T2). Thus, the drive transistor 22 is driven to a constant level which is independent of the data input to the pixel when the display element is to be illuminated. The brightness is controlled by varying the duty cycle, in particular by varying the time when the drive transistor is turned off.

The drive transistor 22 is turned off by means of a discharge transistor 36 which discharges the storage capacitor 30. When the discharge transistor 36 is turned on, the capacitor 30 is rapidly discharged and the drive transistor turned off.

The discharge transistor is turned on when the gate voltage reaches a sufficient voltage. A photodiode 38 is illuminated by the display element 2 and generates a photocurrent in dependence on the light output of the display element 2. This photocurrent charges a discharge capacitor 40, and at a certain point in time, the voltage across the capacitor 40 will reach the threshold voltage of the discharge transistor 40 and thereby switch it on. This time will depend on the charge originally stored on the capacitor 40 and on the photocurrent, which in turn depends on the light output of the display element.

The photodiode 38 is shown connected to the power line 26, but it may instead connect to the charging line 32.

Thus, the data signal provided to the pixel on the data line 6 is supplied by the address transistor 16 (T1) and is stored on the discharge capacitor 40. A low brightness is represented by a high data signal (so that only a small amount of additional charge is needed for the transistor 36 to switch off) and a high brightness is represented by a low data signal (so that a large amount of additional charge is needed for the transistor 36 to switch off).

This circuit thus has optical feedback for compensating ageing of the display element, and also has threshold compensation of the drive transistor 22, because variations in the drive transistor characteristics will also result in differences in the display element output, which are again compensated by the optical feedback. For the transistor 36, the gate voltage over threshold is kept very small or negative, so that the threshold voltage variation is much less significant.

As shown in FIG. 4, each pixel also has a bypass transistor 42 (T3) connected between the source of the drive transistor 22 and a bypass line 44. This bypass line 44 can be common to all pixels. This is used to ensure a constant voltage at the source of the drive transistor when the storage capacitor 30 is being charged. Thus, it removes the dependency of the source voltage on the voltage drop across the display element, which is a function of the current flowing. Thus, a fixed gate-source voltage is stored on the capacitor 30, and the display element is turned off when a data voltage is being stored in the pixel.

Figure 5:
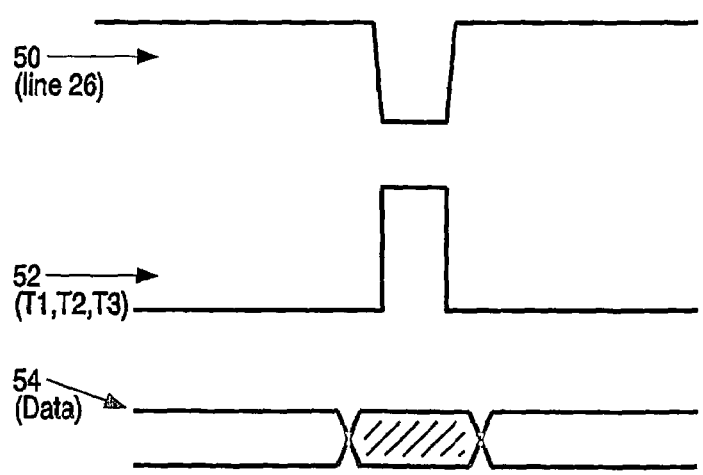
FIG. 5 is a timing diagram for explaining the operation of the circuit of FIG. 4.

FIG. 5 shows timing diagrams for the operation of the circuit of FIG. 4 and is used to explain the circuit operation in further detail.

The power supply line has a switched voltage applied to it. Plot 50 shows this voltage. During the writing of data to the pixel, the power supply line 26 is switched low, so that the drive transistor 22 is turned off. This enables the bypass transistor 42 to provide a good ground reference.

The control lines for the three transistors T1, T2, T3 are connected together, and the three transistors are all turned on when the power supply line is low. This shared control line signal is shown as plot 52.

Turning on T1 has the effect of charging the discharge capacitor 40 to the data voltage. Turning on T2 has the effect of charging the storage capacitor 30 to the constant charging voltage from charging line 32, and turning on T3 has the effect of bypassing the display element 2 and fixing the source voltage of the drive transistor 22. As shown in plot 54, data (the hatched area) is applied to the pixel during this time.

Figure 6:
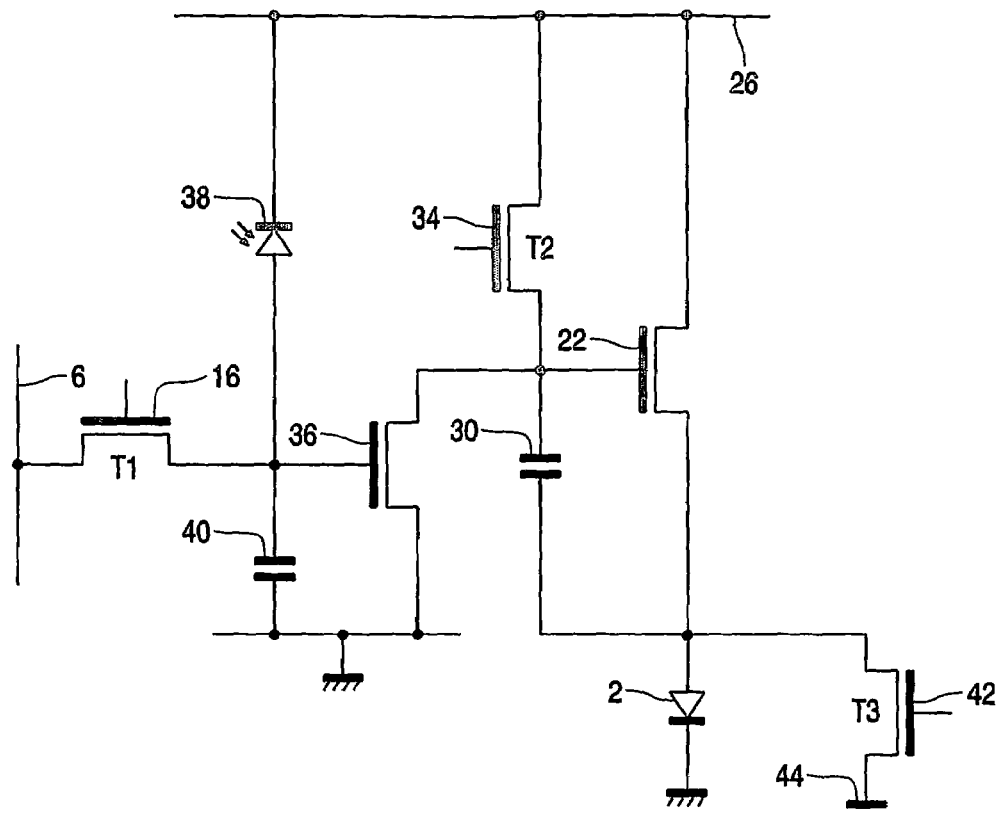
FIG. 6 shows a second example of pixel circuit according to the invention.

FIG. 6 shows a first variation to the circuit in which the same reference numerals are used for the same components, and the circuit is again shown implemented with n-type transistors only, and is therefore suitable for implementation using amorphous silicon transistors. In this circuit, the charging transistor is connected to the power supply line 26, and the voltage on the power supply line is not switched.

Figure 7:
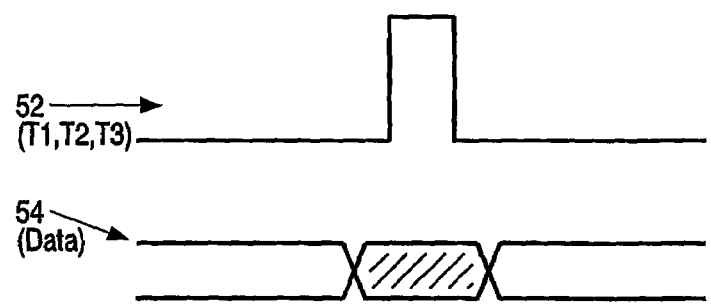
FIG. 7 is a timing diagram for explaining the operation of the circuit of FIG. 6.

FIG. 7 shows the timing diagram for this circuit. The storage of data in the pixel is carried out when all three transistors T1, T2, T3 are turned on, by plot 52.

Figure 8:
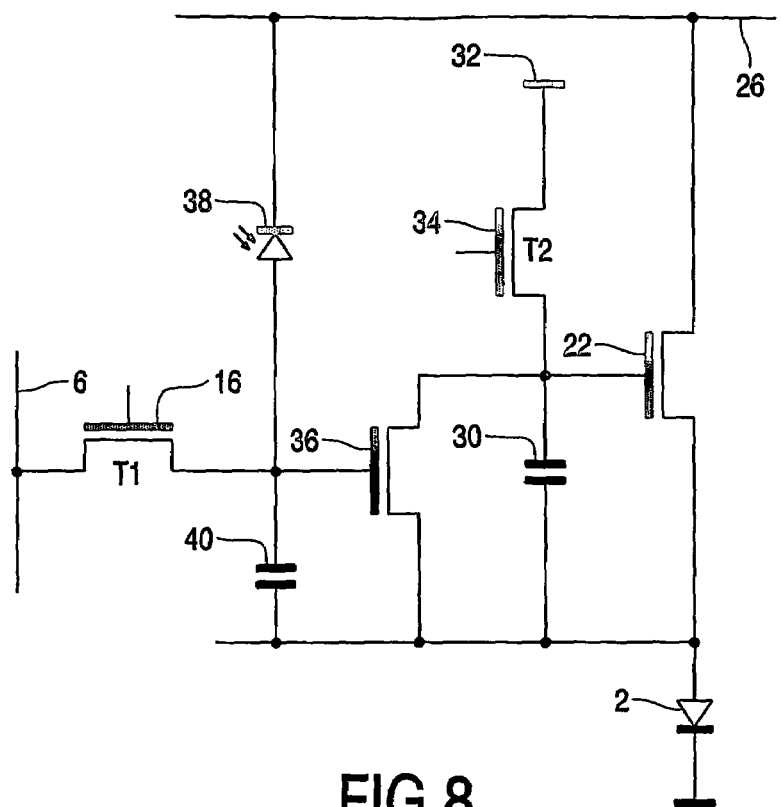
FIG. 8 shows a simplification to the circuit of FIG. 4.

The two circuits above use a bypass transistor 42 to fix the drive transistor source voltage when programming the pixel. In a variation to the circuit, this transistor is not used. The removal of transistor 42 combined with control of the voltage on the charging line 32 can provide an additional level of threshold voltage compensation, as the optical feedback system will not compensate for the threshold voltage of the drive transistor perfectly. FIG. 8 shows a variation of FIG. 4 in which no bypass transistor is used. In FIG. 8, the photodiode 38 is again shown connected to the power line 26, but it may again connect to the charging line 32.

In the circuit of FIG. 8, the voltage on the charging line 32, which is used to charge the storage capacitor 30, can be used to provide additional threshold voltage compensation. In this circuit, when the threshold voltage of the drive transistor 22 increases, the anode of the LED 2 is not pulled down fully to the low voltage on the power line 26 during pixel programming. The data voltage on the conductor 6 has negative voltage value (for example around −5V). This means that when data is stored on the discharge capacitor 40 through the address transistor 16, the higher anode voltage results in a larger voltage being stored across the capacitor 40. This in turn gives rise to a brighter pixel, as the charging time for the discharge capacitor 40 is increased, and the operation of the discharge transistor 36 is therefore delayed. Thus, the threshold voltage drift in the drive transistor 22 results in the pixel being driven to a brighter output. In particular, the connection of the source of drive transistor 22 to the discharge capacitor 40 makes the timing of operation of the discharge transistor dependent on the anode voltage during pixel charging, which is a function of the threshold voltage of the drive transistor 22.

This compensation effect can be tuned by adjusting the voltage on the charging line 32, and is also affected by the sizing of the various circuit components. A lower voltage on the charging line 32 results in an increased voltage error on the anode of the LED 2. There is, of course, a lower limit for the voltage on the charging line 32 as the storage capacitor 30 must have sufficient charge to drive the drive transistor 22. If desired, some of the voltage on the power line 26 can be coupled to the storage capacitor 30 through parasitic capacitances of the drive transistor 22 or an additional coupling capacitance. Thus, this additional compensation effect can be tuned through control of the voltage on the charging line 32 and the design of the different circuit components, in particular the drive transistor 22.

For the above circuits, the more rapidly the discharge transistor 36 can discharge the gate of the drive transistor 22, the better the dark state of the display will be. The gate of the drive transistor 22 is always charged during addressing of the pixel and thus needs to be discharged rapidly if the LED 2 is to be driven to a dark state. In particular, during the addressing phase when the power line 26 is low, the gate of the drive transistor needs to be fully discharged before the power line returns high if the pixel is to be driven to a dark state.

Figure 9:
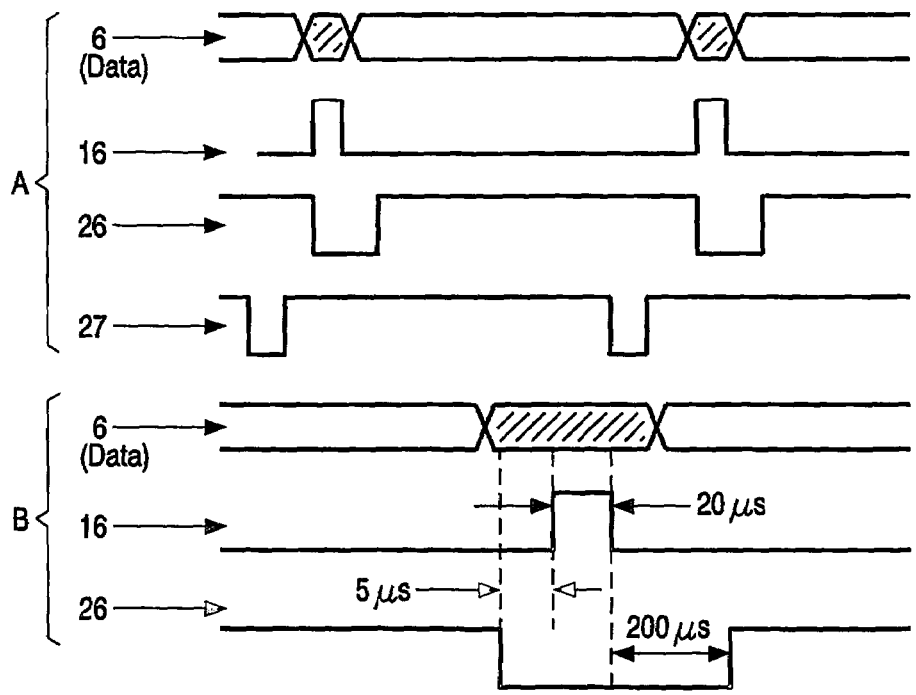
FIG. 9 is a timing diagram for explaining the operation of the circuit of FIG. 8.

FIG. 9 shows in greater detail a preferred timing sequence for the operation of the circuit of FIG. 8, although the same principle can be applied to the circuits of FIGS. 4 and 6 and indeed to other circuits described below. As shown in FIG. 9A the time at which the power line 26 is brought high after pixel programming is delayed until after the end of the address pulse on transistor 16. This gives much greater time for the discharge transistor 36 to discharge the gate of the drive transistor 22. FIG. 9A shows the timing of data on the data conductor 6 (the hatched part of the plot), the timing of the address pulse for transistor 16 and the power supply line voltage 26. FIG. 9A also shows the frame-by-frame field pulse 27.

FIG. 9B shows in greater detail an example of the pulse timing. As shown, the address pulse for transistor 16 may have a duration of around 20 µs, and the return of the power supply line 26 to the high voltage (for example 15 V) may be around 200 µs. This gives an improved dark state and also minimises any possibility of threshold voltage drift in the discharge transistor 36. In particular, this transistor 36 does not need to be biased above threshold to achieve rapid discharge of the gate of the drive transistor 22, as a result of the additional time available (the 200 µs delay). This scheme does not affect the complexity or length of time for addressing the display, as other rows may be addressed while the power supply line continues to be low. This drive scheme therefore enables the circuits to be used while maintaining a high contrast display and without requiring special driving conditions for the discharge transistor 36 (for example over threshold drive conditions).

The above timing scheme improves the contrast of the display by ensuring the display element 2 is turned off when the display is driven to a dark state. For operation of the circuit when not driven to a dark state, the drive transistor 22 is turned off by the circuit during the display period, and the timing of this turn off dictates the light output. The quality of the threshold compensation carried out by the circuit is dependent on the rate at which the drive transistor 22 is turned off by the discharge transistor 36. Thus, the quality of operation of the circuit is determined by the turn on rate (or "sub-threshold slope") of the discharge transistor 36. Ideally, this device should turn on instantly at a given voltage. Instead, however, amorphous silicon TFTs exhibit a finite turn on rate approximated by an exponential rise of approximately one decade per volt gate swing. This sub-threshold slope depends in part upon the amorphous silicon processes used, but is mainly dependent upon the thickness and permittivity of the gate insulator. The sub-threshold slope approximately doubles if the gate insulator is halved in thickness. However, the gate insulator layer must also function as the cross-over dielectric at many crossings of the gate (row) and data (column) metals so that a thin gate insulator would result in low yield due to step coverage problems as well as high electric fields in the insulator layer. An additional problem arises due to the large cross over capacitances. Typically, the gate insulator has a thickness of 300-400 nm and is formed from PECVD silicon nitride.

In order to improve the performance of the circuit, the gate dielectric insulator can be formed with a locally thinner portion which defines the gate dielectric of the discharge transistor 36. This can be achieved by depositing the gate insulator layer in two stages, with the first stage patterned by a mask step to remove the first gate insulator layer where a thinner gate dielectric is required. This then allows the discharge transistor 36 to be provided with a thin gate insulator while all other devices use the thicker complete gate insulator. Layout design then allows the thin gate insulator region or regions to cover no steps in gate metal, and only cover the channel region of the discharge transistor 36, so that any risk of yield reduction is minimised.

Figure 10:
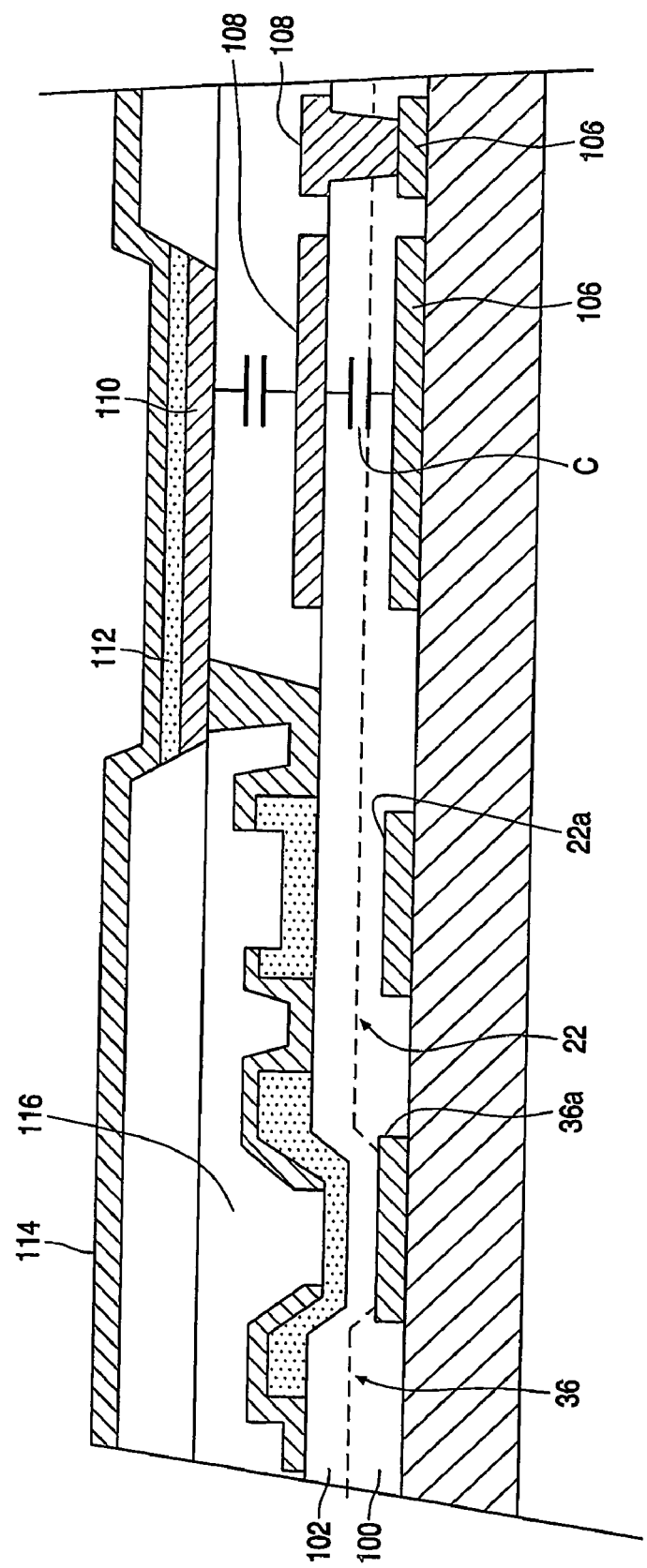
FIG. 10 is used to explain a preferred process for manufacturing the circuit of FIG. 8.

FIG. 10 shows schematically this approach.

It should be noted that the layout represented in FIG. 10 does not correspond to the circuit of FIG. 8, and is provided merely by way of example to show the principle of providing the discharge transistor 36 with a thinner gate insulator layer.

As shown in FIG. 10, the gate dielectric layer comprises two layers 100, 102. The first layer 100 is patterned so that it is removed over the gate conductor 36a of the discharge transistor 36. In all other regions of the substrate, the two gate insulator layers 100, 102 are patterned together. Thus, the drive transistor 22 has the complete gate insulator layer. The two gate insulator layers 100, 102 also define the capacitor dielectric layer for the capacitor C shown in FIG. 10.

In the structure of FIG. 10, the gate electrodes and a number of other contacts are formed by a bottom metal layer 106, and the source and drain electrodes as well as other contacts are formed by the top metal layer 108. The pixel electrode 110 is formed over the active matrix substrate, and the LED layers 112 are sandwiched between the pixel electrode 110 and the cathode layer 114. The insulating/planarisation layer 116 is typically silicon nitride.

One or more of the capacitors in the pixel circuit may also use the thin gate insulator layer as a dielectric. This can enable a reduction in area to achieve the same capacitance. Again, careful layout can still enable the thin insulator region not to cover any steps in underlying gate metal layer.

Simulations show that reducing the gate insulator thickness of the discharge transistor 36 by a factor of 2 (from 330 nm to 165 nm) can give a three-fold improvement in the circuit performance in correcting voltage threshold drift in the drive transistor 22.

This approach has been shown schematically in a pixel circuit with bottom gate TFTs and for amorphous silicon transistors. The same principles can be applied to top gate TFT processes as well as to transistors using low temperature polysilicon.

The examples above are common-cathode implementations, in which the anode side of the LED display element is patterned and the cathode side of all LED elements share a common unpatterned electrode. This is the current preferred implementation as a result of the materials and processes used in the manufacture of the LED display element arrays. However, patterned cathode designs are being implemented, and this can simplify the pixel circuit.

Figure 11:
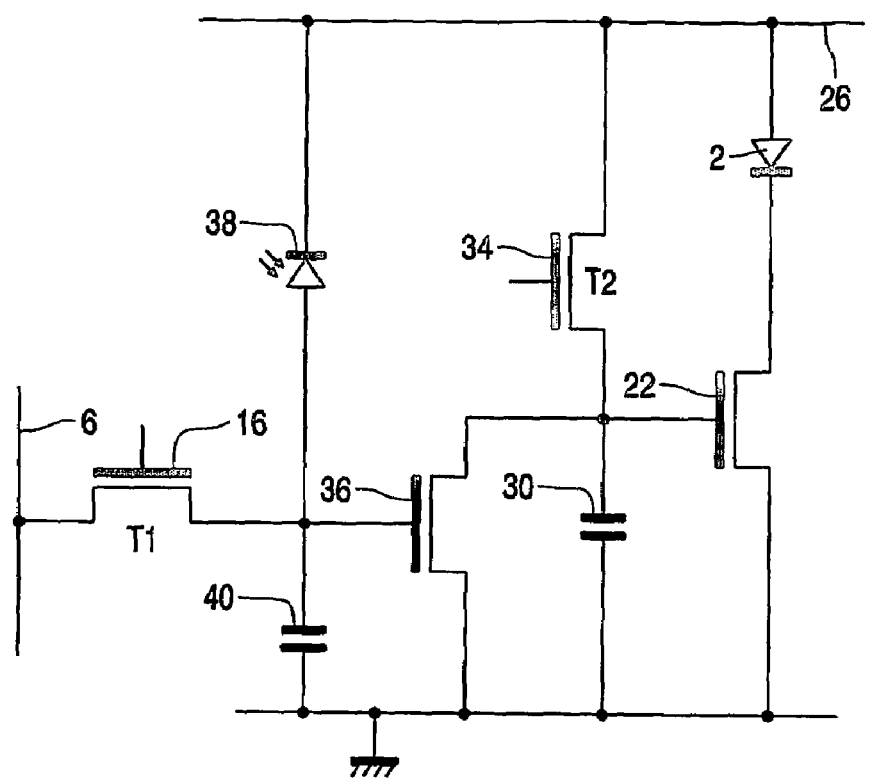
FIG. 11 shows a third example of pixel circuit according to the invention.

FIG. 11 shows a common-anode pixel configuration, again implemented with amorphous silicon n-type transistors. The anode of the LED display element 2 is connected to the power supply line 26, and the drive transistor 22 is connected between the display element 22 and ground. The charging transistor 34 is connected to the power supply line 26, and the voltage on the power supply line is not switched.

Figure 12:
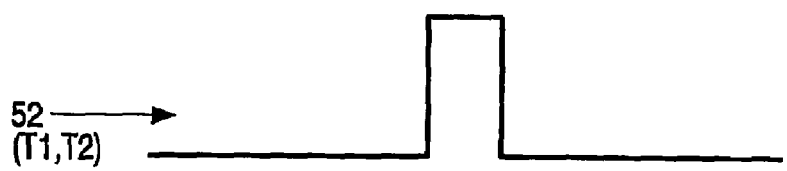
FIG. 12 is a timing diagram for explaining the operation of the circuit of FIG. 11.
Figure 12:

When data is stored in the circuit, the transistors T1 and T2 are turned on (as shown in plot 52 of FIG. 12). The storage capacitor 30 is charged to the power supply line voltage, and there is no need for any bypass transistor, as the source of the drive transistor 22 is connected directly to ground, as the display element is on the drain side of the drive transistor 22. This simplifies the circuit, although the display element will be turned on during the addressing period. This addressing period is relatively short, for example 32 microseconds within a total frame period of (in one possible example) 20 ms.

Figure 13:
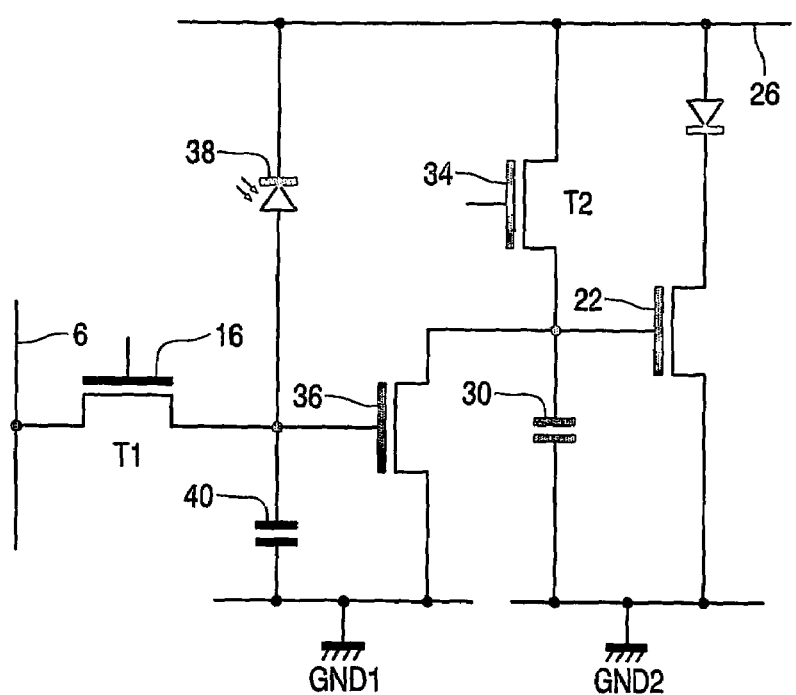
FIG. 13 shows a first modification to the circuit of FIG. 11.

FIG. 13 shows a first variation to the circuit of FIG. 11, in which separate ground lines gnd1 and gnd2 are provided for the discharge capacitor 40 (which stores the data voltage) and the storage capacitor 30. This improves the ground contact for the data storage capacitor, and the pixel operates in the same way as for FIG. 11.

Figure 14:
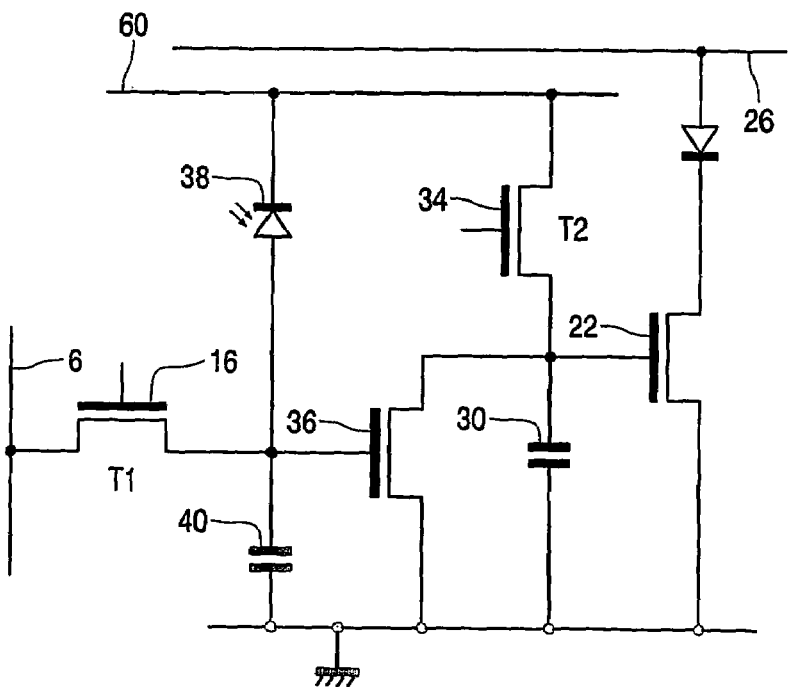
FIG. 14 shows a second modification to the circuit of FIG. 11.
Figure 15:
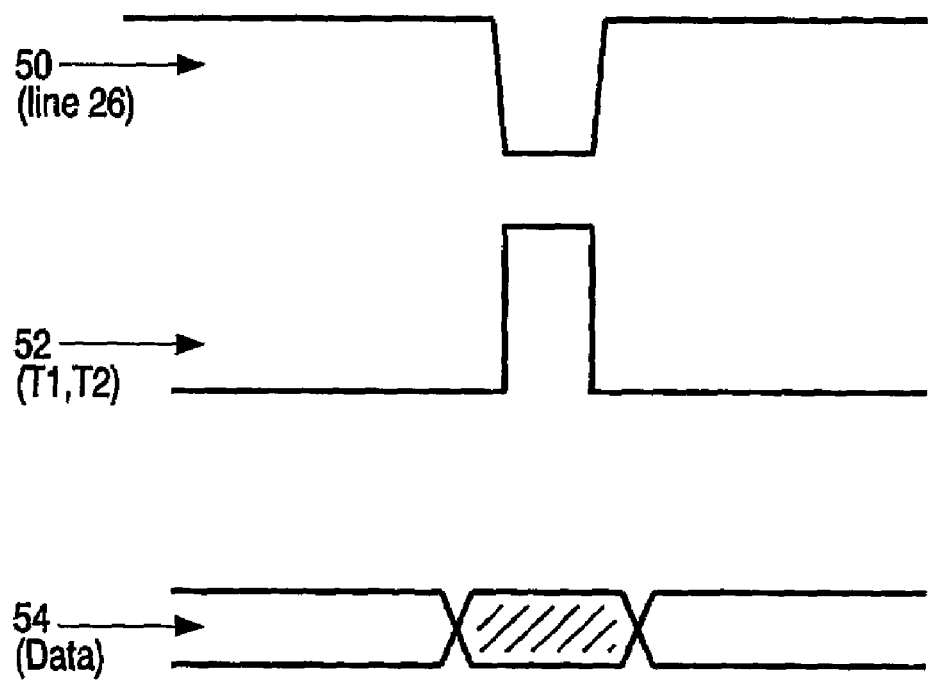
FIG. 15 is a timing diagram for explaining the operation of the circuit of FIG. 14.

FIG. 14 shows a second variation to the circuit of FIG. 11, in which the power supply line 26 for supplying the display element 2 is separated from the supply line 60 for supplying the charge to the storage capacitor 30 and the discharge capacitor 40 through the photodiode 38. This enables the power supply line 26 to be switched, as shown in plot 50 of FIG. 15, so that the display element can be turned off during the addressing phase. This improves the darkness of a pixel drive to black.

Figure 16:
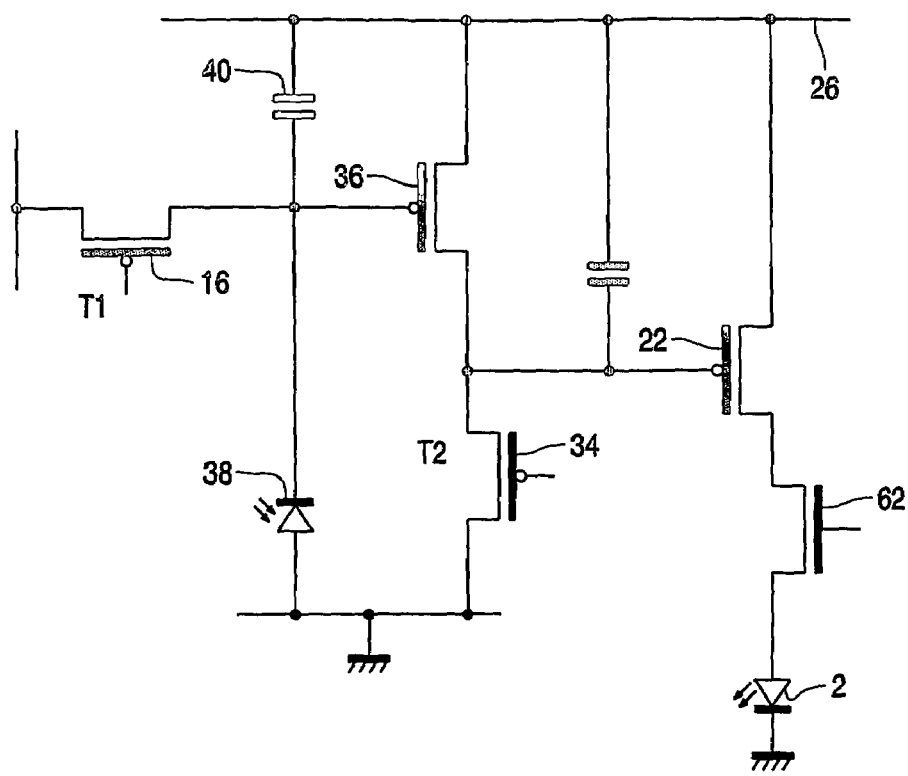
FIG. 16 shows a fourth example of pixel circuit according to the invention.

The circuits above are all n-type only arrangements which are therefore suitable for amorphous silicon implementation. FIG. 16 shows an n-type and p-type circuit, suitable for implementation using a low temperature polysilicon process, and which uses n-type and p-type devices. This circuit also enables a common-cathode LED display element arrangement to be used.

The drive transistor 22 is implemented as a p-type device. The storage capacitor 30 is connected between the power supply line 26 and the gate of the drive transistor 22, as the source is now connected to the power supply line. Similarly, the discharge transistor 36 is a p-type device, and the discharge capacitor 40 is thus connected between the power supply line 26 and the gate of the transistor 36. In this circuit, charge is removed from the capacitor 40 by the photodiode 38 to result in a drop in the gate voltage of the discharge transistor 36 until it turns on.

The charging transistor 34 is also a p-type device and is connected between the gate of the drive transistor 22 and ground. The charging operation effected by the transistor 34 is thus to charge the capacitor until the full power supply voltage is across it. This holds the gate of the drive transistor 22 at ground, which turns the drive transistor fully on (as it is a p-type device).

Fundamentally, therefore, the circuit operates in the same way as the circuits above, with adaptations to allow the use of p-type transistors.

An isolating transistor 62 enables the display element 2 to be turned off during the addressing phase so that black performance is preserved. In FIG. 16, this is an n-type device, although it may of course be a p-type device so that an implementation with all p-type devices is possible.

Figure 17:
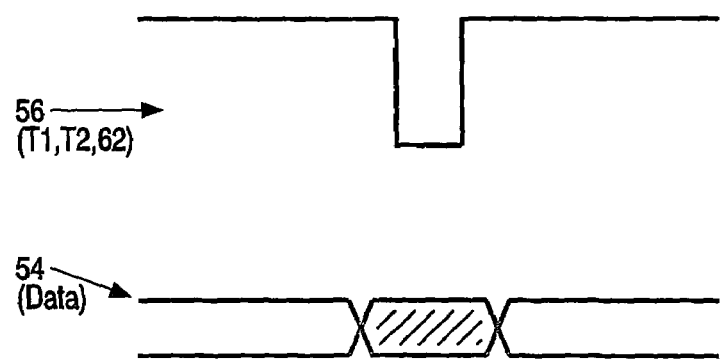
FIG. 17 is a timing diagram for explaining the operation of the circuit of FIG. 16.

As shown in FIG. 17, the gate control signal 56 turns the n-type transistor 62 on when it is high, and when it goes low for the addressing period, the transistor 62 is turned off while the p-type transistors T1, T2 are turned on.

One problem with the use of a LTPS drive transistor is that variations in transistor characteristics across the display give rise to image non-uniformity. This non-uniformity can give rise to different threshold voltages of the discharge transistor 36, and the circuit of FIG. 16 is sensitive to these threshold voltage variations.

Figure 18:
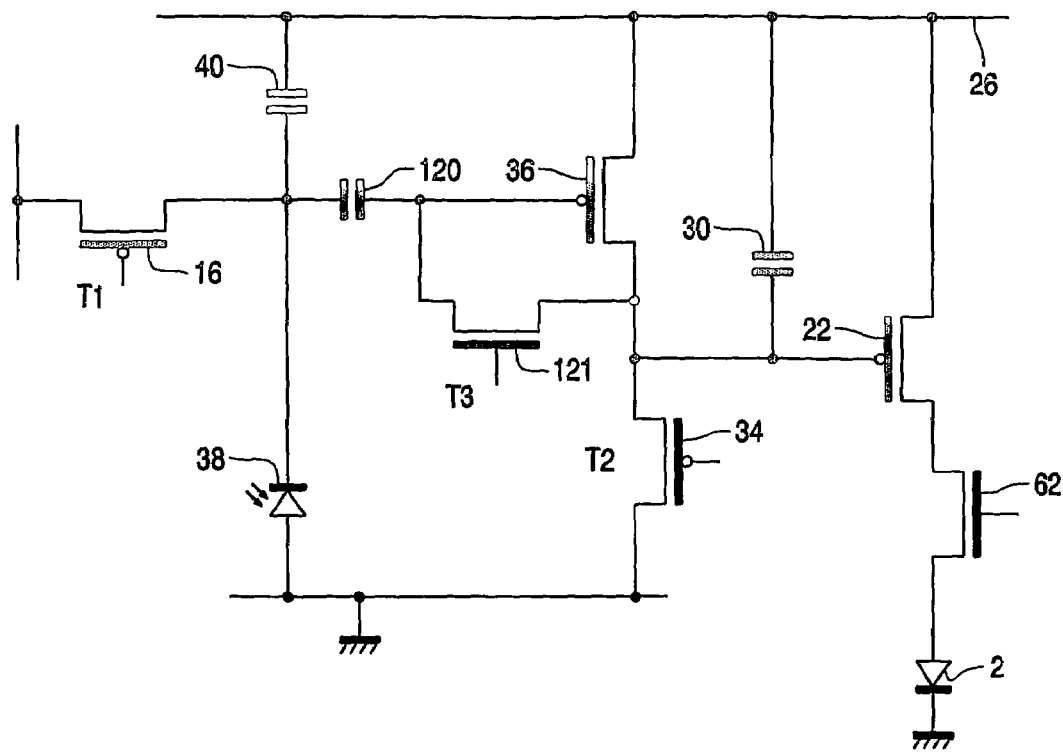
FIG. 18 shows a modification to the circuit of FIG. 16.

It is possible to provide threshold voltage correction for the discharge transistor 36, and a circuit for performing this is shown in FIG. 18.

The circuit of FIG. 18 corresponds to that of FIG. 16, and the same reference numerals have been used for the same components. In FIG. 18, a threshold voltage capacitor 120 is introduced between the pixel input and the gate of the discharge transistor 36. In addition, a shorting transistor 121 (T3) is provided between the gate and drain of the discharge transistor 36.

Figure 19:
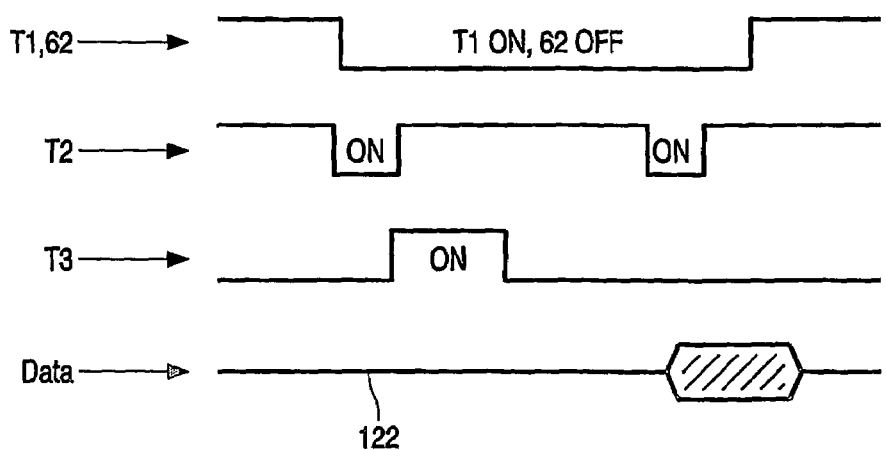
FIG. 19 is a timing diagram for explaining the operation of the circuit of FIG. 18.

The timing diagram for the circuit of FIG. 18 is shown in FIG. 19.

During the addressing phase, when the addressing transistor 16 (T1) is turned on, the charging transistor 34 (T2) is turned on for a pulse to charge the storage capacitor 30. Towards the end of this pulse, the shorting transistor T3 is turned on. When the charging transistor 34 (T2) has been turned off, the threshold voltage of the discharge transistor 36 is measured on the threshold voltage capacitor 120, while a reference voltage 122 is held on the column. In particular, a current passes through the discharge transistor 36, through the shorting transistor T3 and this discharges the threshold voltage capacitor 120 until the threshold voltage is stored across the threshold voltage capacitor 120 (this is the case if the reference voltage 122 is equal to the source voltage), at which point the discharge transistor 36 turns off.

After this period, the data voltage is put on the column. The voltage on the gate of the discharge transistor 36 comprises the sum of the data voltage, which is stored on capacitor 40, and the threshold voltage stored on capacitor 120, so that the gate voltage compensates for threshold voltage variations of the discharge transistor 36.

The charging transistor 34 (T2) is again turned on to charge the storage capacitor 30 for a second time. There is then a period between the turn off of the charging transistor 34 (T2) and the turn off of the addressing transistor 16 (T1). This enables a good black state to be achieved, because if the data is zero then the charging transistor 34 is held at its threshold, and starts to discharge the storage capacitor 30 before the display element 2 becomes connected to the drive transistor 22 through transistor 62. Thus any light output while the gate of the drive transistor 22 is being discharged is avoided.

This circuit is tolerant to significant variations of the threshold voltage and mobility of all devices in the circuit in addition to performing differential ageing correction.

Figure 20:
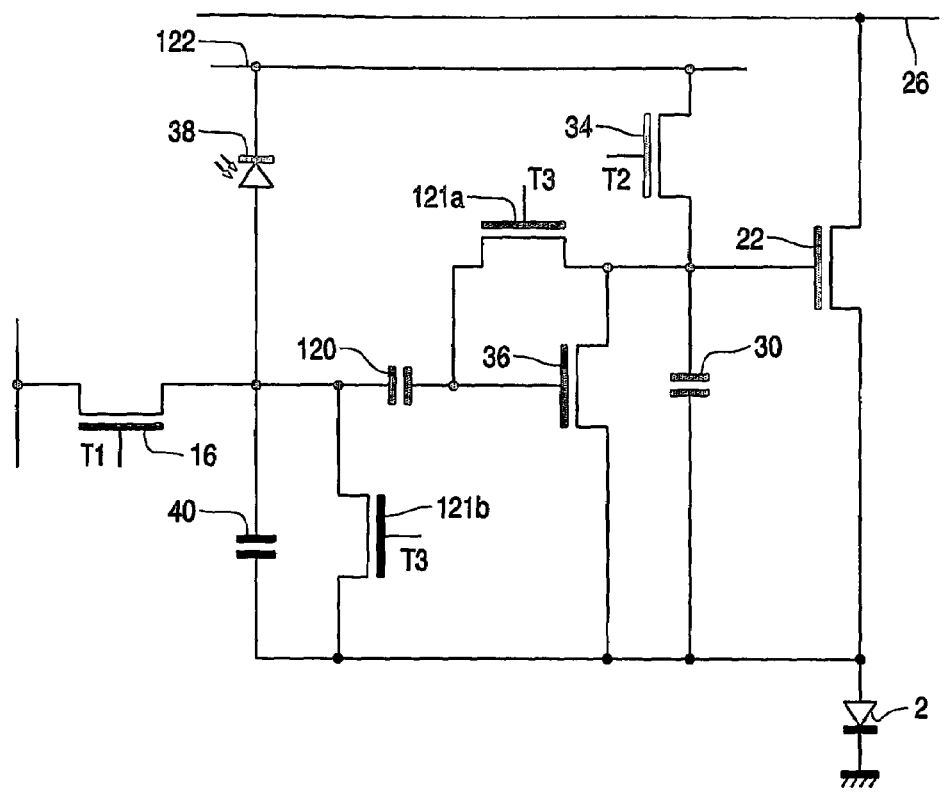
FIG. 20 shows another modification to the circuit of FIG. 16.

FIG. 20 shows a circuit similar to FIG. 18, but for implementation using n-type, for example amorphous silicon, transistors. The same components as in FIG. 18 are present, and are given the same reference numbers. This circuit avoids the need for the isolating transistor 62 by providing a switched voltage on the power supply line 26. Also, two shorting transistors 121a and 121b are required.

In FIG. 20, the photodiode 38 is connected to a separate charging line 122. The advantage of this is that, as it is not an ideal current source, it is less susceptible to cross talk caused by voltage drops on the power line. The addressing can also be pipelined so that the time required to measure the threshold voltage of the discharge transistor does not add to the overall addressing time. In the circuit of FIG. 18, the column voltage must be fixed during the measurement of the discharge transistor 36 threshold voltage, and the address transistor T1 (16) is turned on for the full addressing period.

Figure 21:
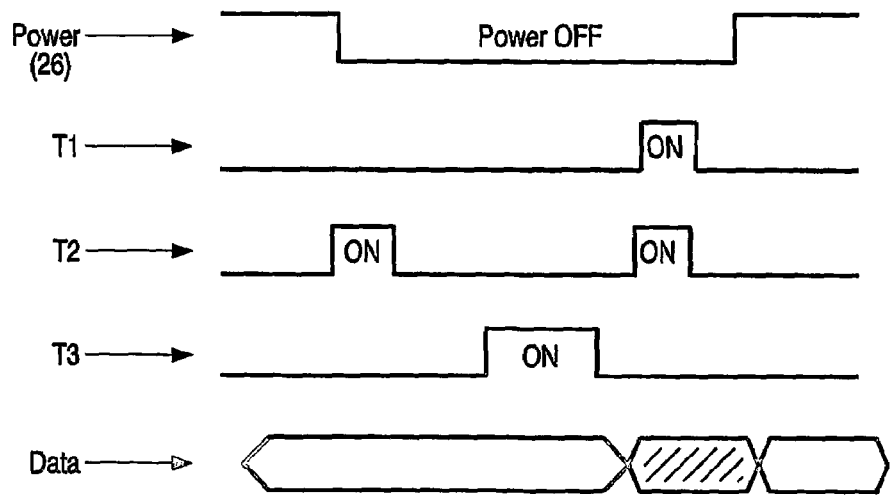
FIG. 21 is a timing diagram for explaining the operation of the circuit of FIG. 20.

FIG. 21 is the timing diagram for the circuit of FIG. 20. The operation is similar to the operation of the circuit of FIG. 18 shown in the timing diagram of FIG. 19. However, the address transistor T1 (16) is turned on only for a short pulse (long enough for the storage capacitor 30 to be charged from the line 122 and the discharge capacitor 40 to be charged from the column data line), which enables the pipelined addressing described above to be implemented.

Figure 22:
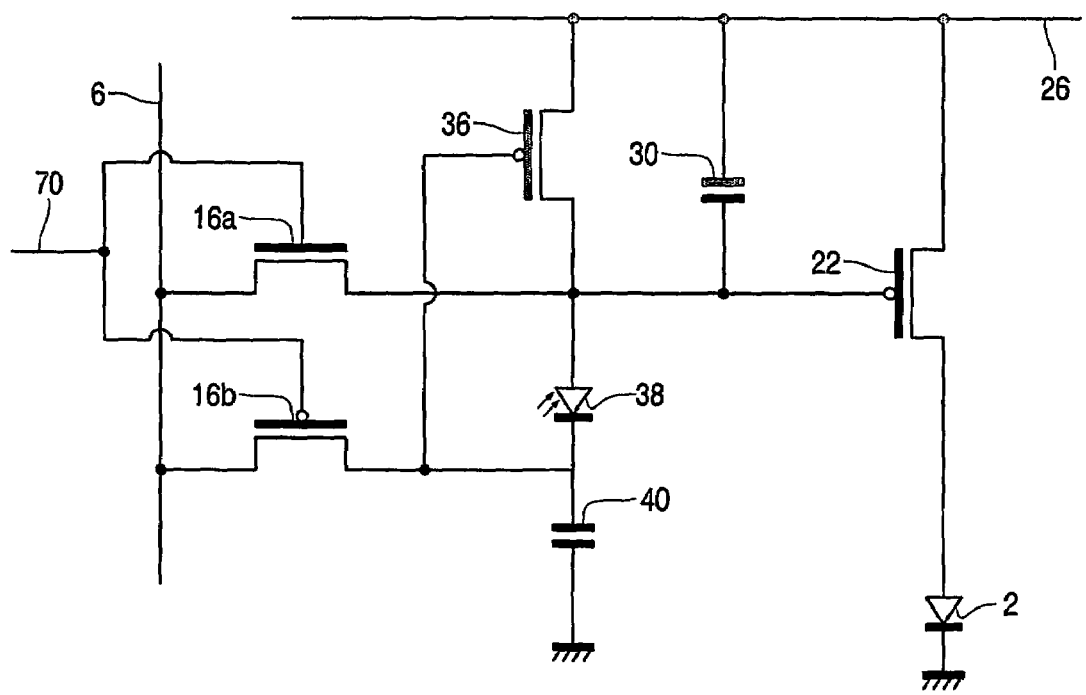
FIG. 22 shows a fifth example of pixel circuit according to the invention.

FIG. 22 shows a further alternative arrangement in which the display element can be turned off during addressing, but without the need for an isolating transistor in series with the display element as in the circuits of FIGS. 16 and 18.

Each pixel has two address transistors 16a, 16b. The first address transistor 16a is connected between the data signal line 6 and the storage capacitor 30, so that it can be used to charge the storage capacitor to a selected first voltage. The second address transistor is connected between the data signal line 6 and the discharge storage capacitor, so that it can be used to charge the discharge capacitor to a selected second voltage.

In this circuit, the storage capacitor can be charged to a discrete number of different voltages. One of these is a voltage which is not sufficient to turn on the drive transistor. Thus, if the pixel is being driven to a black output, the addressing phase will not result in the temporary illumination of the display element, and there is no need for additional transistors to bypass or isolate the display element.

The address transistors are of complementary types, and in the example of FIG. 22, the first 16a is an n-type transistor and the second 16b is a p-type transistor. The gates of the two address transistors 16a, 16b are controlled by a shared select line 70.

The discharge transistor 36, the photodiode 38 and the discharge capacitor 40 are in series between the power supply line 26 and ground. The gate of the discharge transistor 36 is connected to the capacitor 40 so that the voltage across the capacitor 40 determines the gate voltage of the transistor 36, as in previous circuits.

The drive transistor 22 is a p-type device, with its source connected to the power supply line and its drain connected to the anode of the display element.

The circuit is addressed in two phases. In a first phase P1 shown in FIG. 23, a high pulse is applied to the select line 70 (plot 72) to switch on the first address transistor 16a. At this time, a signal on the data line 6 (plot 74) is applied to the storage capacitor 30, and this voltage is for driving the drive transistor 22 to provide one of the discrete drive levels.

Figure 23:
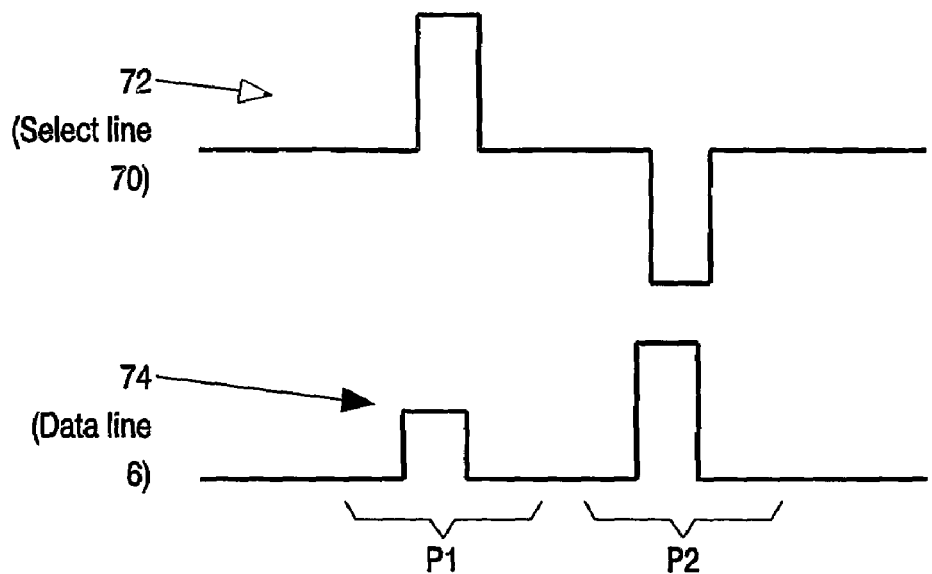
FIG. 23 is a timing diagram for explaining the operation of the circuit of FIG. 22.

In second phase P2 shown in FIG. 23, a low pulse is applied to the select line 70 (plot 72) to switch on the second address transistor 16b. At this time, a data signal on the data line 6 (plot 74) is applied to the discharge capacitor 40, and this voltage turns off the discharge transistor 36. The voltages provided on the capacitors 30, 40 reverse bias the photodiode 38.

The desired drive level of the display element is thus converted into two values, one for controlling the voltage applied to the capacitor 30 (which selects one drive level), and one for controlling the voltage applied to the discharge capacitor 40 (which influences the switch off time). Thus, the circuit of FIG. 22 combines multiple level driving with duty cycle control.

Illumination of the photodiode causes the voltage across the capacitor 40 to be reduced, until the voltage reaches a level at which the discharge transistor turns on, and then discharges the storage capacitor 30 as in previous circuits. The charge from the capacitor 40 flows to the storage capacitor 30. As the storage capacitor is much larger, any resulting change in voltage is small, and any resulting change in optical brightness is compensated further by the optical feedback system.

As mentioned above, the circuit of FIG. 22 combines multiple level driving with duty cycle control. This principle can be applied to the other circuits of the invention. For example, in the circuit of FIG. 4, a discrete number of different voltages can be applied to line 32, in order to select the pixel brightness. The data voltage applied to the capacitor 40 then determines the duty cycle, and the two voltages in combination then determine the pixel output. Thus, the display element can be driven for optimum efficiency at maximum brightness, or it can be driven with a number of levels to maintain the duty cycle within limits.

In the examples above, optical feedback is used for compensation of the ageing of the LED material and the drive transistor. If the variations in the threshold voltage are very large, which may be the case for amorphous silicon drive transistors, the photocurrent may be insufficient to switch on the discharge transistor 36 within the frame time. In this case, some electrical threshold voltage compensation is needed.

Figure 24:
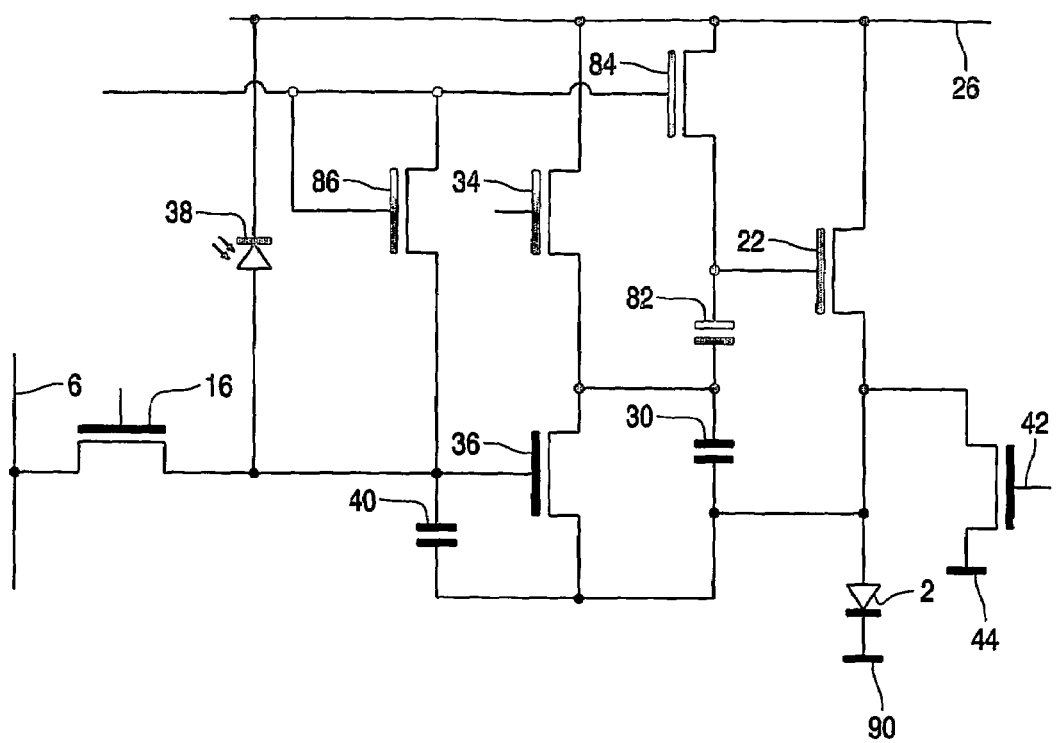
FIG. 24 shows a sixth example of pixel circuit according to the invention.

FIG. 24 shows a pixel circuit which combines optical feedback with electrical threshold compensation for the drive transistor. The gate-source voltage for the drive transistor 22 in this circuit is held on two capacitors in series, a storage capacitor 30 and a threshold capacitor 82. A discharge capacitor 40 is again provided for turning off a discharge transistor 36, which is arranged to short out the storage capacitor 30. The circuit provides the (fixed) drive voltage level on the storage capacitor 30 and stores the drive transistor threshold voltage on the threshold capacitor 82.

The circuit again has a first charging transistor 34 for providing a charging path from the power supply line 26 to the charging capacitor 30. A second charging transistor 84 is provided to enable the threshold capacitor 82 to be charged. A further transistor 86 is provided for turning the discharge transistor 36 hard on, and as will be apparent from the following, this is to enable the storage capacitor 30 to be shorted out during the addressing sequence so that the threshold gate-source voltage of the drive transistor can be stored on the threshold capacitor 82 alone. The common cathode terminal 90 of all display elements is switchable to two voltage levels—a high voltage to reverse bias the display element and ground.

Figure 25:
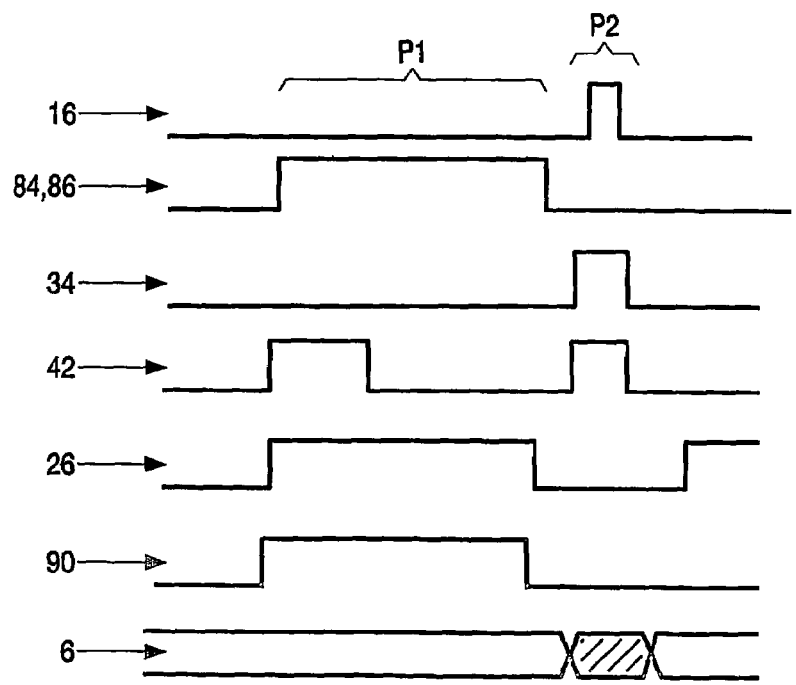
FIG. 25 is a timing diagram for explaining the operation of the circuit of FIG. 24.

FIG. 25 is a timing diagram for the operation of the circuit of FIG. 24. Each row of the timing diagram represents the control signal applied to the circuit element reference identified in FIG. 25. For example, the top plot 16 gives the signal applied to the gate of the address transistor 16. As all transistors in the circuit of FIG. 24 are n-type, high pulses are used to turn on the transistors, so that the address transistor is turned on by the single high pulse in plot 16.

An initial phase P1 of the addressing phase is for storing the threshold voltage on the capacitor 82. During this phase, the power supply line 26 has a high voltage applied to it, as does the common cathode 90 thereby to reverse bias and switch off the display element.

Initially, the storage capacitor is shorted by turning on the discharge transistor. This is achieved by switching on transistor 86 (to bring the gate of transistor 36 high) and by switching on the bypass transistor 42, which ensures that the lower terminal of the storage capacitor is grounded. At the same time, charging transistor 84 is turned on charges the threshold capacitor 82, and the drive transistor is turned on. The drive current through the drive transistor passes to ground through the bypass transistor 42.

The bypass transistor 42 is then turned off. The drive transistor then discharges the threshold capacitor 82 until the threshold voltage is stored on the threshold capacitor 82 at which point the drive transistor turns off.

The transistors 84 and 86 are then turned off, and the power line 26 and cathode line 90 are brought low for the data addressing phase P2.

During phase P2, the charging transistor 34 is used to charge the storage capacitor 30 to a voltage on the common line 44, through the bypass transistor 42 which is turned on. Thus, a fixed voltage is stored on the storage capacitor 30, as in previous circuit examples.

Alternatively, the charging transistor 34 and the photodiode can be connected to their own charging line, to enable charging of capacitor 30 even when the power supply line 26 is low.

The address transistor 16 is also turned on to pass a data signal to the discharge capacitor 40.

The circuit thus operates to store a gate-source voltage on the series capacitor arrangement 30, 82 which is equal to a constant value plus the threshold voltage. This provides threshold voltage compensation.

The power line is then switched high, and the circuit operates in the same way as for the circuits described above.

Figure 26:
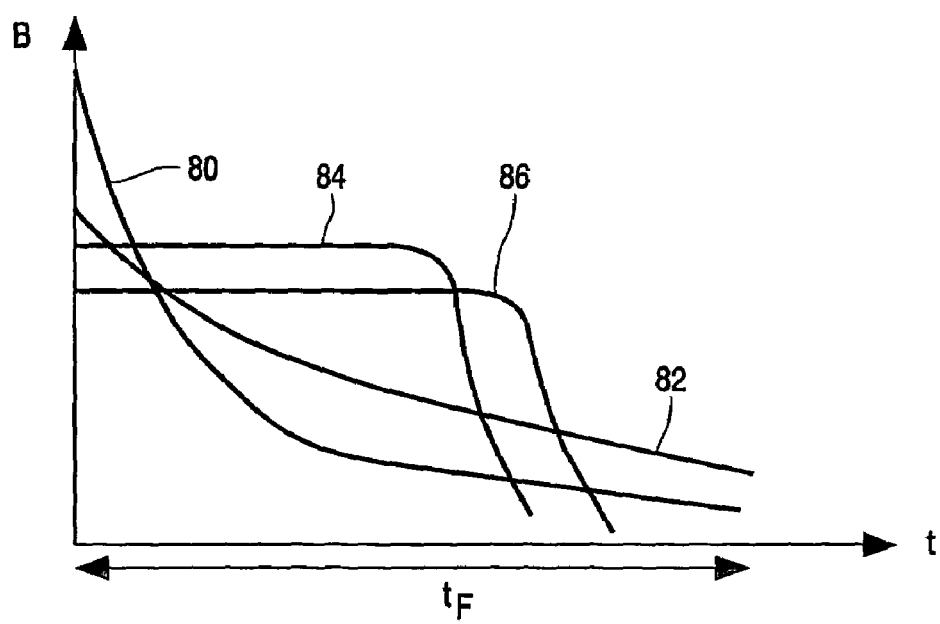
FIG. 26 is a graph to explain the benefits of the various circuits of the invention.

FIG. 26 is used to explain how the ageing compensation for all circuits above affects the brightness output. The pixel brightness B is plotted against time t, and the time period $t_F$ is the frame period.

Plot 80 shows how the brightness varies over the frame period for the known compensation circuit of FIG. 3. The optical feedback causes the brightness to tail off over time. After ageing of the pixel, the peak brightness is lower, and the optical feedback thus causes a less rapid decrease in brightness as shown in plot 82. The overall light output (the area under the curve) thus remains constant.

The circuit of the invention operates as shown in plot 84, and provides a constant light output followed by a sharp cutoff. After ageing, as shown in plot 86, the constant brightness is lower, but the cutoff is later.

In the examples above, the light dependent element is a photodiode, but pixel circuits may be devised using phototransistors or photoresistors. Circuits have been shown using a variety of transistor semiconductor technologies. A number of variations are possible, for example crystalline silicon, hydrogenated amorphous silicon, polysilicon and even semiconducting polymers. These are all intended to be within the scope of the invention as claimed. The display devices may be polymer LED devices, organic LED devices, phosphor containing materials and other light emitting structures.

A number of different pixel circuits have been given above, and certain specific features and improvements have been explained only with reference to individual embodiments. For example, one embodiment above uses a delayed power line low voltage pulse to give additional time for the pixel to be reset to a dark state. Another embodiment above has threshold compensation for the discharge transistor. It should be understood that these, and other, specific features and improvements can be applied to other embodiments where appropriate. It will be apparent to those skilled in the art when these features are appropriate for other pixel circuit variations and when they are not.

Various other modifications will be apparent to those skilled in the art.

The invention claimed is:

1. An active matrix display device comprising an array of display pixels, each pixel comprising:
   a current-driven light emitting display element;
   a drive transistor for driving a current through the display element;
   a storage capacitor for storing a voltage to be used for addressing the drive transistor;
   a discharge transistor for discharging the storage capacitor thereby to switch off the drive transistor; and a light-dependent device for controlling the timing of the operation of the discharge transistor by varying the gate voltage applied to the discharge transistor in dependence on the light output of the display element, wherein a discharge capacitor is provided between the gate of the discharge transistor and a constant voltage line, and the light dependent device is for charging or discharging the discharge capacitor.

2. A device as claimed in claim 1, wherein the light-dependent device controls the timing of the switching of the discharge transistor from an off to an on state.

3. A device as claimed in claim 1, wherein the light dependent device comprises a photodiode.

4. A device as claimed in claim 1, wherein each pixel further comprises an address transistor connected between a data signal line and an input to the pixel.

5. A device as claimed in claim 1, wherein the drive transistor is connected between a power supply line and the display element.

6. A device as claimed in claim 5, wherein the storage capacitor is connected between the gate and source of the drive transistor.

7. A device as claimed in claim 1, wherein each pixel further comprises a charging transistor connected between a charging line and the gate of the drive transistor.

8. A device as claimed in claim 7, wherein the charging line comprises a power supply line which supplies power to the display element and the drive transistor.

9. A device as claimed in claim 1, wherein each pixel further comprises a bypass transistor connected between the source of the drive transistor and a bypass line.

10. A device as claimed in claim 1, wherein each pixel further comprises an isolating transistor connected in series with the drive transistor.

11. A device as claimed in claim 1, wherein each pixel comprises first and second address transistors each connected between the data signal line and a respective one of the storage capacitor and the gate of the discharge transistor.

12. A device as claimed in claim 11, wherein one of the first and second address transistors is an n-type transistor and the other is a p-type transistor.

13. A device as claimed in claim 1, wherein the transistors of each pixel comprise amorphous silicon n-type transistors.

14. A device as claimed in claim 1, wherein the transistors of each pixel comprise polysilicon transistors.

15. A device as claimed in claim 1, wherein the transistors of each pixel comprise p-type polysilicon transistors.

16. A device as claimed in claims 1, wherein the transistors of each pixel comprise microcrystalline transistors.

17. A device as claimed in claim 1, wherein each pixel further comprises a threshold voltage storage capacitor for storing a threshold voltage of the drive transistor, wherein the threshold voltage storage capacitor is in series with the storage capacitor between the gate and source of the drive transistor.

18. A device as claimed in claim 17, wherein each pixel comprises a transistor is to enable the threshold capacitor to be charged.

19. A device as claimed in claim 18, wherein each pixel further comprises a transistor is for turning the discharge transistor on.

20. A device as claimed in claim 1, wherein the gate insulator of the discharge transistor is thinner than the gate insulator of the drive transistor.

21. A device as claimed in claim 1, wherein the gate insulator of the discharge transistor is thinner than the gate insulator of an address transistor connected between a data signal line and node corresponding to the gate of the drive transistor.

22. A device as claimed in claim 21, wherein the gate insulator of the drive transistor comprises first and second gate insulator layers, and the gate insulator of the address transistor comprises only one of the first and second gate insulator layers.

23. A device as claimed in claim 1, wherein each pixel further comprises a threshold storage capacitor for storing a threshold voltage of the discharge transistor.

24. A device as claimed in claim 1, wherein the current-driven light emitting display element comprises an electroluminescent display element.

25. A method of driving an active matrix display device comprising an array of display pixels each comprising a drive transistor and a current-driven light emitting display element, the method comprising, for each addressing of the pixel:
applying a drive voltage to an input of the pixel;
storing a voltage derived from the drive voltage on a discharge capacitor;
driving the drive transistor using a voltage on a storage capacitor;
switching on a discharge transistor using charge flow through a light dependent device illuminated by the light output of the display element, the charge flow charging or discharging the discharge capacitor; and
discharging the storage capacitor using the discharge transistor thereby to turn off the drive transistor.

* * * * *